(12) United States Patent
Hartmann-Thompson et al.

(10) Patent No.: US 12,116,494 B2
(45) Date of Patent: Oct. 15, 2024

(54) LOW DIELECTRIC CONSTANT CURABLE COMPOSITIONS

(71) Applicant: 3M INNOVATIVE PROPERTIES COMPANY, St. Paul, MN (US)

(72) Inventors: Claire Hartmann-Thompson, Lake Elmo, MN (US); Evan L Schwartz, Vadnais Heights, MN (US); John P. Baetzold, North St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 582 days.

(21) Appl. No.: 17/296,081

(22) PCT Filed: Nov. 22, 2019

(86) PCT No.: PCT/IB2019/060086
§ 371 (c)(1),
(2) Date: May 21, 2021

(87) PCT Pub. No.: WO2020/109954
PCT Pub. Date: Jun. 4, 2020

(65) Prior Publication Data
US 2022/0010154 A1 Jan. 13, 2022

Related U.S. Application Data

(60) Provisional application No. 62/773,436, filed on Nov. 30, 2018.

(51) Int. Cl.
*C09D 11/30* (2014.01)
*C08F 220/18* (2006.01)
(Continued)

(52) U.S. Cl.
CPC ........ *C09D 11/30* (2013.01); *C08F 220/1811* (2020.02); *C09D 11/101* (2013.01); *C09D 11/107* (2013.01); *H10K 71/135* (2023.02)

(58) Field of Classification Search
CPC ..... C09D 11/30; C09D 11/101; C09D 11/107; H10K 71/135; C08F 220/1811
(Continued)

(56) References Cited

U.S. PATENT DOCUMENTS 6,384,172 B1 5/2002 Dvornic
6,419,797 B1 7/2002 Scherf
(Continued)

FOREIGN PATENT DOCUMENTS

JP 2015-000874 1/2015
WO WO 2016-196541 12/2016
(Continued)

OTHER PUBLICATIONS

Chwang, "Thin Film Encapsulated Flexible Organic Electroluminescent Displays" Applied Physics Letters, 2003, vol. 83, No. 3, pp. 413-415.
(Continued)

*Primary Examiner* — Ruiyun Zhang
(74) *Attorney, Agent, or Firm* — Jeffrey M. Olofson

(57) ABSTRACT

Low dielectric constant curable compositions include a first alkyl (meth)acrylate monomer with 12 or more carbon atoms, a crosslinking monomer, a copolymeric additive of a polyisobutylene-polysiloxane block copolymer, and at least one initiator. The curable composition is solvent free and inkjet printable. Upon curing the curable composition forms a non-crystalline, optically clear layer with a dielectric constant of less than or equal to 3.0 at 1 MegaHertz.

17 Claims, 2 Drawing Sheets

(51) Int. Cl.
*C09D 11/101* (2014.01)
*C09D 11/107* (2014.01)
*H10K 71/13* (2023.01)

(58) Field of Classification Search
USPC .......................................... 428/1.1, 1.3, 1.33
See application file for complete search history.

(56) References Cited

U.S. PATENT DOCUMENTS

| | | | |
|---|---|---|---|
| 8,137,807 | B2 | 3/2012 | Clapper |
| 9,837,633 | B2 | 12/2017 | Lee |
| 2015/0252125 | A1 | 9/2015 | Moro |
| 2016/0372704 | A1 | 12/2016 | Lee |
| 2017/0130103 | A1 | 5/2017 | Woo |
| 2018/0079919 | A1 | 3/2018 | Steert |

FOREIGN PATENT DOCUMENTS

| | | |
|---|---|---|
| WO | WO 2017-058758 | 4/2017 |
| WO | WO 2018-102179 | 6/2018 |
| WO | WO 2018-193392 | 10/2018 |
| WO | WO 2019-123123 | 6/2019 |

OTHER PUBLICATIONS

Gong, "End Functionalization of Hyperbranched Poly(siloxysilane). Novel Crosslinking Agents and Hyperbranched-Linear Star Block Copolymers", Journal of Polymer Science, Part A: Polymer Chemistry, Jan. 2000, vol. 38, pp. 2970-2978.

Hartmann-Thompson, "Hyperbranched Polycarbosiloxanes and Polycarbosilanes via Bimolecular Non-Linear Hydrosilylation Polymerization", Polymer, 2012, vol. 53, No. 24, pp. 5459-5468.

Omura, Naoki, Synthesis, Characterization, and Properties of Stars Consisting of Many Polyisobutylene Arms Radiating from a Core of Condensed Cyclosiloxanes, MACROMOLECULES, 1997, 30, pp. 3204-3214.

International Search Report for PCT International Application No. PCT/IB2019/060086, mailed on Feb. 12, 2020, 5 pages.

LOW DIELECTRIC CONSTANT CURABLE COMPOSITIONS

FIELD OF THE DISCLOSURE

This disclosure relates to curable compositions which have a low dielectric constant relative to typical polymeric compositions, are printable, and can be used to form articles.

BACKGROUND

Increasingly, optical devices are becoming more complicated and involve more and more functional layers. As light travels through the layers of the optical device, the light can be altered by the layers in a wide variety of ways. For example, light can be reflected, refracted or absorbed. In many cases, layers that are included in optical devices for non-optical reasons adversely affect the optical properties. For example, if a support layer is included that is not optically clear, the absorption of light by the non-optically clear support layer can adversely affect the light transmission of the entire device.

Multi-layer optical and electronic devices utilize a wide array of different materials with different properties. Adding to the complexity of the layers used in these devices, is that often layers have to fulfill more than one function within an article. For example, a single material layer may be called upon to function as a barrier layer but must also provide exact spacing between layers and also be optically clear so as to not deleteriously affect the optical properties.

It has become increasingly difficult to prepare organic polymeric compositions which have suitable optical properties and yet retain the desirable features of organic polymers, features such as ease of processing, flexibility, and the like.

SUMMARY

This disclosure relates to polyisobutylene-polysiloxane di-block copolymers, curable compositions prepared with polyisobutylene-polysiloxane block copolymers, articles prepared with the curable compositions, and methods for preparing the articles.

In some embodiments, the curable composition comprise a first monomer comprising an alkyl (meth)acrylate monomer with 12 or more carbon atoms, a crosslinking monomer, a copolymeric additive comprising a polyisobutylene-polysiloxane block copolymer, and at least one initiator. The curable composition is solvent free and inkjet printable, having a viscosity of less than 30 centipoise at a temperature of from room temperature to less than 60° C. Upon curing the curable composition forms a non-crystalline, optically clear layer with a dielectric constant of less than or equal to 3.0 at 1 MegaHertz.

Also disclosed are articles, in some embodiments the articles comprise a substrate with a first major surface and a second major surface, and a cured organic layer with a first major surface and a second major surface, where the first major surface of the cured organic layer is adjacent to at least a portion of the second major surface of the substrate. The cured organic layer comprises a crosslinked (meth)acrylate-based layer that comprises a copolymeric additive comprising a polyisobutylene-polysiloxane block copolymer and has a thickness of from 1-50 micrometers, and has a dielectric constant of 3.0 or less at 1 MegaHertz, and is non-crystalline and optically clear. The cured organic layer is generally prepared from the curable compositions described above.

Also disclosed are polyisobutylene-polysiloxane di-block copolymers. In some embodiments, the polyisobutylene-polysiloxane di-block copolymers comprise a linear polyisobutylene block, and a branched polysiloxane block. In some embodiments, the polyisobutylene-polysiloxane di-block copolymer is prepared by the hydrosilylation reaction of an ethylenically unsaturated linear polyisobutylene oligomer and a silane-functional branched siloxane oligomer.

Also disclosed are methods of preparing articles. In some embodiments, the method of preparing an article comprises providing a substrate with a first major surface and a second major surface, providing a curable composition, disposing the curable composition on at least a portion of the second major surface of the substrate to form a curable layer, curing the curable layer to form a cured organic layer having a first major surface and a second major surface, where the first major surface of the cured organic layer is adjacent to the second major surface of the substrate. The cured organic layer has a thickness of from 1-50 micrometers. The curable composition comprises a first monomer comprising an alkyl (meth)acrylate monomer with 12 or more carbon atoms, a crosslinking monomer, a copolymeric additive comprising a polyisobutylene-polysiloxane block copolymer, and at least one initiator, where the curable composition is solvent free and inkjet printable, having a viscosity of less than 30 centipoise at a temperature of from room temperature to less than 60° C., and upon curing forms a non-crystalline, optically clear layer with a dielectric constant of less than or equal to 3.0 at 1 MegaHertz.

BRIEF DESCRIPTION OF THE DRAWINGS

The present application may be more completely understood in consideration of the following detailed description of various embodiments of the disclosure in connection with the accompanying drawings.

Figure 1:
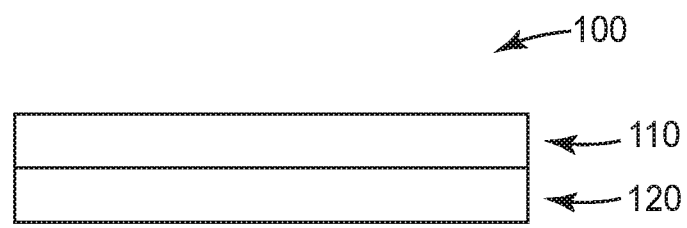
FIG. 1 shows a cross sectional view of an embodiment of an article of this disclosure.

In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The increased complexity of optical devices places increasingly difficult requirements upon the materials used in them. In particular, organic polymeric materials have found widespread use in optical devices, but increasingly stringent requirements are being placed upon these polymeric materials.

For example, thin organic polymeric films are desirable for a wide range of uses in optical devices, as adhesives, protective layers, spacer layers, and the like. As articles have become more complex, the physical demands upon these layers have increased. For example, as optical devices have become more compact, and at the same time often include more layers, there has been an increasing need for thinner layers. At the same time, since the layers are thinner, the layers also need to be more precise. For example, a thin spacer layer (of 1 micrometer thickness) needs to be level and free of gaps and holes in order to provide the proper spacing function. This requires deposition of the organic layer in a precise and consistent manner.

One function that thin spacer layers are called upon to fulfill in multilayer optical and electronic devices is electrical insulation, in order to electrically isolate a layer or series of layers from other nearby layers. Therefore, it is desirable to have thin layers of organic polymeric materials that have a low dielectric constant. In this context, a low dielectric constant material is one which has a dielectric constant of 3.0 or less at 1 MegaHertz. This function also requires precision in the formation of the layers as the presence of gaps or pinholes can destroy the insulating ability of the layer.

Another physical feature that is desirable and is becoming increasingly important for thin organic layers that function as encapsulating compositions, is resistance to plasma processes. Plasma-enhanced processes, such as plasma-enhanced chemical vapor deposition, are often utilized in the preparation of articles that include thin organic layers such as those described in this disclosure. Organic layers adjacent to the deposited layers are often susceptible to degradation by exposure to plasma. Therefore, it is desirable that the thin organic layers be resistant to etching by plasma. Resistance to plasma etching can be determined in a variety of ways. One method for characterizing plasma etching resistance is by etching a polymer film and dividing the etch depth by the amount of time of etching to find an etch rate in terms of etched film thickness divided by etch time. Another method quantifies the amount of film etched in a given amount of time relative to the original film thickness, as described U.S. Pat. No. 9,837,633 (Lee et al.). As mentioned above, it is desirable to have organic layers that are resistant to etching by plasma processes. Particularly desirable are organic layers that are essentially unchanged by plasma etching.

Additionally, not only are organic layers called upon to fulfill their physical role (protection, spacing, and the like) they must also provide the requisite optical properties. Among the properties that are becoming increasingly important is optical clarity.

For example, thin film encapsulation (TFE) layers are used to prevent air and moisture ingress into the OLED device. The TFE is typically composed of alternating layers of inorganic and organic materials (Chwang, Applied Physics Letters 83, 413 (2003)). The function of the inorganic layers is to block the ingress of air and moisture into the OLED device. The functions of the organic layers are twofold: 1) to planarize the substrate and present a smooth interface for the deposition of the inorganic layer; and 2) to decouple any defects (pinholes, micro-cracks) that may occur in the inorganic layers on either side of the organic layer. The organic layer can be thought of as a buffer layer that is critical for the success of the inorganic layer barrier function.

Among the methods that have been developed to provide a precise and consistent deposition of organic polymeric material are printing techniques. In printing techniques, a polymer or a curable composition that upon curing forms a polymer, is printed onto a substrate surface to form a layer. In the case of printable polymers, typically solvents are added to make the polymer a solution or dispersion capable of being printed. When polymers are used, typically a drying step is necessary after printing to produce the desired polymeric layer. In the case of curable compositions that upon curing form polymers, the curable compositions may or may not include a solvent. The curable composition is then cured, typically either with the application of heat or radiation (such as UV light) and if a solvent is used the layer may also be dried. A wide variety of printing techniques can be used, with inkjet printing being particularly desirable because of the excellent precision of inkjet printing.

As was mentioned above, an example of an optical device that utilizes thin film layers are OLED (organic light-emitting diode) devices. In particular, the organic light-emitting devices are susceptible to degradation from the permeation of certain liquids and gases, such as water vapor and oxygen. To reduce permeability to these liquids and gases, barrier coatings are applied to the OLED device. Typically, these barrier coatings are not used alone, rather a barrier stack is used which can include multiple dyads. Dyads are two-layer structures that include a barrier layer and decoupling layer. The decoupling layer provides a planarized and/or smooth surface for the deposition of the inorganic barrier layer.

In this disclosure, curable compositions, which may be considered "inks", that are capable of being printed are described which have a number of traits that make them suitable for the formation of layers within multilayer optical devices. The terms "ink" and "curable composition" are used interchangeably herein, in a non-limiting sense, since the curable compositions, as is discussed below, are capable of being printed they can be described as inks, however, the curable compositions can also be coated by other techniques that do not involve printing. Many of these traits desired for the curable compositions are contradictory to each other, and therefore it is unexpected that an ink composition can have these contradictory traits. For example, the formulations, when cured have a dielectric constant of 3.0 or less at 1 MegaHertz. In order to achieve this low dielectric constant, monomers that are branched hydrocarbons, often highly branched hydrocarbons, with relatively long chains are used, and these branched, long chain monomers have a relatively high viscosity. However, in order to be printable, especially inkjet printable, the viscosity cannot be too high. Often this viscosity problem can be overcome through the use of solvents to dilute the monomer mixtures and thus reduce their viscosity. The use of solvents is not suitable for the inks of the present disclosure because it is undesirable to have to dry the prepared coatings, and drying is known to affect coatings by decreasing the thickness and drying can also adversely affect the surface smoothness and may also create defects in the coating. In many applications for optical devices, it is desired that the coatings be precise, that is to say that they do not lose thickness or smoothness upon drying. Therefore, the inks of the present disclosure are "100% solids", meaning that they do not contain volatile solvents and that all of the mass that is deposited on a surface remains there, no volatile mass is lost from the coating. Another technique that can be used to decrease the viscosity of inks is to raise the temperature of the ink. However, this is also not suitable for the inks of the present disclosure because the inks are often applied to substrates that are either thermally sensitive or are kept at ambient temperature and therefore coating a hot ink onto the room temperature substrate can cause defects in the coating. These defects can come about either from a lack of proper wetting on the substrate surface or from other inconsistencies that form a non-uniform coating.

Therefore, the curable compositions of the present disclosure are useful as inks, meaning that they are capable of being printed by for example inkjet printing techniques without the use of solvents at a temperature of from room temperature to about 60° C., or even room temperature to 35° C. Typically, the printable curable composition has a viscosity at these temperatures of 30 centipoise or less. In some embodiments, the viscosity is from 1-20 centipoise at room temperature.

The curable ink composition, when coated and cured to form a cured organic layer, produces a cured organic layer that has a dielectric constant of 3.0 or less at 1 MegaHertz and is optically clear. In some embodiments, the cured organic layer has a dielectric constant of 2.8 or less at 1 MegaHertz, or 2.7 or less at 1 MegaHertz, 2.6 or less at 1 MegaHertz, 2.5 or less at 1 MegaHertz, or even 2.3 or less at 1 MegaHertz.

It is also desirable, and in some instances necessary, to provide a predictable dielectric response at a range of frequencies that are relevant to the end-use application. In some embodiments, it is desirable for the cured organic layer to have a small difference between the dielectric constant at 100 kHz and the dielectric constant at 1 MHz. This difference is referred to as the "Dk-Delta value". One particularly desirable feature of the the additives of this disclosure is that they have very low Dk-Delta values of 0-0.01. Therefore, the addition of these additives to organic layers gives the desirable feature that the cured organic layer has a low measured Dk-Delta value. In some embodiments, the cured organic layer has a Dk-Delta value of 0.05 or less, less than 0.04, or even below 0.03.

The cured organic layer typically has a thickness of from 1-50 micrometers, in some embodiments 2-10 micrometers, and a surface roughness of less than 10 nanometers, in some embodiments less than 5 nanometers. Surface roughness in this context refers to the arithmetic mean deviation $R_a$ as defined by the equation:

$$R_a = \frac{1}{n}\sum_{i=1}^{n} |y_i|$$

Where the roughness trace includes n ordered equally spaced data points along the trace, and $y_i$ is vertical distance from the mean line to the $i^{th}$ point. In this way, the cured organic layer is suitable for use as a decoupling layer as described above.

The curable ink composition is a reactive mixture that comprises at least one first monomer comprising an alkyl (meth)acrylate monomer with 12 or more carbon atoms, a crosslinking monomer, a copolymeric additive comprising a polyisobutylene-polysiloxane block copolymer, and at least one initiator. The curable ink composition is solvent free and inkjet printable, having a viscosity of less than 30 centipoise at a temperature of from room temperature to less than 60° C., and upon curing forms a non-crystalline, optically clear layer with a dielectric constant of 3.0 or less at 1 MegaHertz. Crystallinity is not desirable in the curable compositions of this disclosure for a number of reasons. In the curable state, crystallinity is not desirable, especially when the curable composition is to be inkjet printed, as crystalline compositions can clog the inkjet nozzles. In the cured state, crystallinity can adversely affect the optical properties of the cured composition as is well known in the art.

Also disclosed herein are articles, especially optical articles that comprise multiple layers of films, substrates and coatings. Among the articles of this disclosure are articles comprising a substrate, a cured organic layer adjacent to the substrate, and an inorganic barrier layer disposed on the cured organic layer. The cured organic layer comprises a crosslinked (meth)acrylate-based layer that has a thickness of from 1-50 micrometers, and has a dielectric constant of less than or equal to 3 at 1 MegaHertz, and is optically clear.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

As used herein, the term "adjacent" refers to two layers that are proximate to another layer. Layers that are adjacent may be in direct contact with each other, or there may be an intervening layer. There is no empty space between layers that are adjacent.

The curable ink compositions are "substantially solvent free" or "solvent free". As used herein, "substantially solvent free" refers to the curable ink compositions having less than 5 wt-%, 4 wt-%, 3 wt-%, 2 wt-%, 1 wt-% and 0.5 wt-% of non-polymerizable (e.g. organic) solvent. The concentration of solvent can be determined by known methods, such as gas chromatography (as described in ASTM D5403). The term "solvent free" as it implies that no solvent is present in the composition. It should be noted that whether the curable ink composition is substantially solvent free or solvent free, no solvent is deliberately added.

Typically, the curable ink compositions are described as "100% solids". As used herein, "100% solids" refers to curable ink compositions that do not contain volatile solvents and that all of the mass that is deposited on a surface remains there, no volatile mass is lost from the coating.

The terms "Tg" and "glass transition temperature" are used interchangeably. If measured, Tg values are determined by Differential Scanning calorimetry (DSC) at a scan rate of 10° C./minute, unless otherwise indicated. Typically, Tg values for (meth)acrylate copolymers are not measured but are calculated using the well-known Fox Equation, using the monomer Tg values provided by the monomer supplier, as is understood by one of skill in the art. In the present copolymers, since the Tg values are often measured as they do not just contain commercially available monomers.

The terms "room temperature" and "ambient temperature" are used interchangeably and have their conventional meaning, referring to temperatures of from 20-25° C.

The term "organic" as used herein to refer to a cured layer, means that the layer is prepared from organic materials and is free of inorganic materials other than the polysiloxane segments of the polyisobutylene-polysiloxane block copolymers. The organic layers are free of the inorganic additives, such as inorganic particles, that are frequently added to modify the properties of organic layers.

The term "(meth)acrylate" refers to monomeric acrylic or methacrylic esters of alcohols. Acrylate and methacrylate monomers or oligomers are referred to collectively herein as "(meth)acrylates". The term "(meth)acrylate-based" as used herein refers to a polymeric composition that comprises at least one (meth)acrylate monomer and may contain additional (meth)acrylate or non-(meth)acrylate co-polymerizable ethylenically unsaturated monomers. Polymers that are (meth)acrylate-based comprise a majority (that is to say greater than 50% by weight) of (meth)acrylate monomers.

The terms "free radically polymerizable" and "ethylenically unsaturated" are used interchangeably and refer to a reactive group which contains a carbon-carbon double bond which is able to be polymerized via a free radical polymerization mechanism.

The terms "polymer" and "oligomer" are used herein consistent with their common usage in chemistry. In chemistry, an oligomer is a molecular complex that consists of a few monomer units, in contrast to a polymer, where the number of monomers repeat units is, in theory, not limited. Dimers, trimers, and tetramers are, for instance, oligomers composed of two, three and four monomer repeat units, respectively. Polymers on the other hand are macromolecules composed of many monomer repeated units.

As mentioned above, the terms "siloxane" and "silicone" are used interchangeably and refer to polymers or polymer precursors which contain dialkyl or diaryl siloxane (—SiR$_2$O—) units. The term "polysiloxane" as used herein refers to siloxane blocks in block copolymers, where the siloxane blocks are not linear polydialkylsiloxanes of the form (—SiR$_2$O—)$_n$, commonly termed "silicones". Instead, in the present application the polysiloxanes comprise: cyclics of the type (SiR$_2$—O)$_4$; stars Si(OSiMe$_2$-)$_4$ and RSi(OSiMe$_2$-)$_3$; polycarbosiloxanes of the type —OSiMe$_2$CH$_2$CH$_2$—; and Si$_8$O$_{12}$ polyhedral silsesquioxanes.

The term "hydrocarbon group" as used herein refers to any monovalent group that contains primarily or exclusively carbon and hydrogen atoms. Alkyl and aryl groups are examples of hydrocarbon groups.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl.

The term "aryl" refers to a monovalent group that is aromatic and carbocyclic. The aryl can have one to five rings that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "alkylene" refers to a divalent group that is a radical of an alkane. The alkylene can be straight-chained, branched, cyclic, or combinations thereof. The alkylene often has 1 to 20 carbon atoms. In some embodiments, the alkylene contains 1 to 18, 1 to 12, 1 to 10, 1 to 8, 1 to 6, or 1 to 4 carbon atoms. The radical centers of the alkylene can be on the same carbon atom (i.e., an alkylidene) or on different carbon atoms.

The term "alicyclic" as used herein refers to a group that is both aliphatic and cyclic in nature, containing one or more all-carbon rings which may be saturated or unsaturated, but are not aromatic in character, and may be substituted by one or more alkyl groups.

Unless otherwise indicated, "optically transparent" refers to a layer, film, or article that has a high light transmittance over at least a portion of the visible light spectrum (about 400 to about 700 nm). Typically, optically transparent layers, films, or articles have a luminous transmission of at least 85%, often at least 90%.

Unless otherwise indicated, "optically clear" refers to a layer, film, or article that has a high light transmittance over at least a portion of the visible light spectrum (about 400 to about 700 nm), and that exhibits low haze. Typically, optically clear layers, films, or articles have visible light transmittance values of at least 85%, or even 90%, often at least 95%, and haze values of 5% or less, often 2% or less. Luminous transmission and haze can be measured using the techniques described in the Examples section.

The terms "dielectric constant", "dielectric loss", "loss tangent" are used consistent their commonly understood definitions. Dielectric constant (at any frequency) is the amount of energy stored per cycle of electric field oscillation and is determined as the real part of the complex electrical permittivity defined for Maxwell's equations. Dielectric loss (at any frequency) is the amount of energy dissipated per cycle of electric field oscillation and is determined as the imaginary part of the complex electrical permittivity defined for Maxwell's equations. Loss tangent (at any frequency) is the ratio of the dielectric loss to the dielectric constant.

The term "Dk-Delta" as used herein refers to the difference between the absolute value of the dielectric constant at 100 kHz and the dielectric constant at 1 MHz.

Disclosed herein are polyisobutylene-polysiloxane block copolymers, curable compositions that include polyisobutylene-polysiloxane block copolymers, articles prepared with the curable compositions, and methods of preparing articles with the curable compositions.

Disclosed herein are polyisobutylene-polysiloxane block copolymers comprising a linear polyisobutylene block, and a branched polysiloxane block. These copolymers are di-block copolymers that are the reaction product of an ethylenically unsaturated polyisobutylene oligomer and a hydridosilane-functional polysiloxane. The copolymer reaction is a hydrosilylation reaction. This reaction involves the addition of a hydridosilane (—Si—H) across a carbon-carbon double bond (—C=C—) as is illustrated by Reaction Scheme I below:

$$Z\text{—SiR}^4\text{R}^5\text{H} + \text{H}_2\text{C}=\text{CR}^3\text{—Y} \rightarrow Z\text{—SiR}^4\text{R}^5\text{—H}_2\text{C—CR}^3\text{H—Y}$$

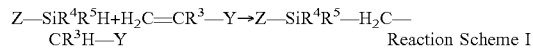
Reaction Scheme I wherein Z comprises a siloxane unit; $R^4$ and $R^5$ are independently H atoms or alkyl groups; $R^3$ is an H atom or alkyl group; and Y is a polyisobutylene oligomeric unit. The polyisobutylene oligomeric units Y are linear groups whereas the siloxane units Z are branched. Typically, this reaction is catalyzed by a metal catalyst, most typically a metallic platinum catalyst. In some embodiments, the polyisobutylene-polysiloxane di-block copolymer comprises 5-40% by weight polysiloxane content.

A wide variety of polyisobutylene oligomers are suitable for use to prepare the polyisobutylene-polysiloxane di-block copolymer of this disclosure.

While a range of molecular weights are suitable for the polyisobutylene oligomers, typically the oligomer is of a relatively low molecular weight. Generally, the molecular weights of oligomers are presented as number average molecular weights ($M_n$). Suitable polyisobutylene oligomers typically have a $M_n$ that is less than 40,000 g/mol, more typically less than 5,000 g/mol, or less than 2,000 g/mol, or even less than 1,500 g/mol. On the other hand, it is desirable that the molecular weight not be too low. Generally, the molecular weight is greater than 500 g/mol, or even greater than 1,000 g/mol. In some embodiments, the number average molecular weight of the polyisobutylene oligomer is 500-2000 g/mol.

Examples of commercially available polyisobutylene oligomers include GLISSOPAL 1000 from BASF; and TPC 175, TPC 1105, TPC 1160, TPC 1285, and TPC 1305 from TPC Group.

Typically, the polysiloxanes contain units of the type: —O—Si($R^6$)$_2$— where $R^6$ is a hydrocarbyl group, typically an alkyl or aryl group, typically a methyl group, and an Si—H (hydridosilane) functional group. A wide range of hydridosilane-functional polysiloxanes are commercially available, including SH1310 (octasilane POSS) from Hybrid Plastics, and a wide range of other hydridosilane-functional materials from suppliers such as Gelest.

In some embodiments, hydridosilane-functional carbosiloxanes are used. Typically the polysiloxanes contain repeat units of the type: —O—Si($R^6$)$_2$—(CH$_2$)$_n$— where $R^6$ is a hydrocarbyl group, typically an alkyl or aryl group, and n is an integer of 2 or greater, in many embodiments n is 2. Frequently, each $R^6$ is an alkyl group, typically methyl.

Disclosed herein are curable compositions that are printable, and thus are described as inks. The curable compositions need not be used as inks, that is to say that they need not be printed and then cured, the curable compositions can be delivered to substrate surfaces in a wide variety of ways, but they are capable of being printed. In particular, the printable compositions of this disclosure are typically capable of being inkjet printed, which means that they have the proper viscosity and other attributes required to be inkjet printed. The term "inkjet printable" is not a process description or limitation, but rather is a material description, meaning that the curable compositions are capable of being inkjet printed, and not that the compositions necessarily have been inkjet printed. This is akin to the expression hot melt processable, which means that a composition is capable of being hot melt processed but does not mean that the composition has been hot melt processed.

The curable ink compositions of this disclosure are reactive mixtures that comprise at least one first monomer comprising an alkyl (meth)acrylate monomer with 12 or more carbon atoms a crosslinking monomer, a copolymeric additive comprising a polyisobutylene-polysiloxane block copolymer, and at least one initiator. The term monomer as used herein may include oligomeric species. The curable ink composition is solvent free and inkjet printable, having a viscosity of less than 30 centipoise at a temperature of from room temperature to less than 60° C., and upon curing forms a non-crystalline, optically clear layer with a dielectric constant of less than or equal to 3.0 at 1 MegaHertz. The ink compositions are inkjet printable and are free from solvents. By free from solvents it is meant that no solvents are added to the curable ink composition, and that no solvents are detectable in the curable composition. The term "solvents" is used herein consistent with the generally understood term of art and encompassing volatile organic and non-organic materials that are liquids at room temperature.

A wide variety of monomeric species are suitable for use as the first monomer of the curable ink composition. The first monomer comprises an alkyl (meth)acrylate monomer with 12 or more carbon atoms. Monomers with hydrocarbon chains that contain greater than 12 carbon atoms are frequently referred to as "long chain hydrocarbons". Typically, these long chain hydrocarbon chains have 12-32 carbon atoms.

A wide range of alkyl (meth)acrylate monomers are suitable. Typically. the alkyl (meth)acrylate monomers are branched and/or contain cyclic groups. Branched and highly branched long chain hydrocarbon monomers are desirable for use in the present curable compositions for a number of reasons. Long chain hydrocarbon monomers are desirable, because they contain a higher ratio of non-polarizable content (that is to say C—C and C—H bonds) relative to the polarizable content (from the carbonyl groups on the (meth)acrylate). It is desirable that the long chain hydrocarbon monomers be branched or even highly branched so that the curable and cured compositions are non-crystalline. In the curable state, crystallinity is not desirable, especially when the curable composition is to be inkjet printed, as crystalline compositions can clog the inkjet nozzles. In the cured state, crystallinity can adversely affect the optical properties of the cured composition as is well known in the art. It is also well known in the chemical arts that "likes attract likes" meaning that similar chemical compositions tend to associate. A commonly used analogy is to view the hydrocarbon chains as strands of spaghetti, which when placed next to each other can agglomerate and form an associated mass. In the case of long chain hydrocarbon chains, especially when the hydrocarbon chains are 12 carbon atoms or larger, the hydrocarbon chains tend to associate and form crystallites. The formation of these crystallites can be prevented through the use of monomers with branched hydrocarbon chains, as the branching tends to disrupt the association of the hydrocarbon chains.

In some embodiments, the first monomer is derived from a 2-alkyl alkanol: i.e. a Guerbet alkanol. The molar carbon number average of said 2-alkyl alkanols of the Guerbet (meth)acrylates is 12 to 32 ($C_{12}$-$C_{32}$), more typically 12 to 20 ($C_{12}$-$C_{20}$). When the optional b) $C_{1-12}$ alkanol (meth)acrylates are present, the carbon number molar average of the alkanols of the a) and b) (meth)acrylic acid ester is 12 to 20 ($C_{12}$-$C_{20}$).

The (meth)acrylic acid ester monomer of 2-alkyl alkanols is derived from $C_{12}$-$C_{32}$ Guerbet alkanols, typically $C_{12}$-$C_{20}$ Guerbet alkanols. These Guerbet alkanols may be obtained by base-catalyzed self-condensation of linear and/or branched alkanols containing 4 to 14 and typically 6 to 12 carbon atoms. Primary or secondary alkanols may be used in the preparation of Guerbet alkanols.

It is known in the art that Guerbet alkanols may be formed from the same or different alkanols i.e. a homo or hetero system. That is, a Guerbet alkanol is the condensation product of two alkanol molecules joined at the beta carbon of the alkanol which has retained the hydroxyl functionality; i.e. 2-alkyl alkanols. The resultant product is therefore a branched primary alkanol containing a single hydroxyl group. It is possible to use mixtures of starting materials in the Guerbet reaction and condense them into mixtures of alkanol products. It is also possible to obtain products which are Guerbet alkanols from a short chained alkanol. It is desired for reasons of polarity, Tg, and modulus that Guerbet alkanols having a molar carbon number average between 12-32 be used. An overview of Guerbet alkanols was published by A. J. O'Lennick in Soap Cosm. Chem. Spec.

(April) 52 (1987). Reference may also be made to U.S. Pat. No. 6,419,797 (Sherf et al.) for method to produce Guerbet alkanols.

The (meth)acrylate ester monomer derived from the Guerbet alkanols is of the formula I below:

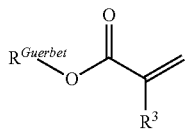

Formula I wherein $R^{Guerbet}$ is derived from a $C_{12}$-$C_{32}$ 2-alkyl alkanol, i.e. an alkyl groups branched at the 2 position; and $R^3$ is H or $CH_3$.

Generally, the (meth)acrylate ester monomer derived from the Guerbet alkanols is of the formula II below:

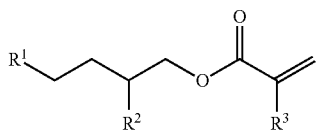

Formula II wherein $R^1$ and $R^2$ are each independently $C_4$ to $C_{14}$ saturated, and branched or linear alkyl; and $R^3$ is H or $CH_3$.

While in some embodiments, the Guerbet alkanol is derived from linear alkanols, i.e. $R^1$ and $R^2$ are linear alkyl groups, it has been found that such (meth)acrylate esters of "linear Guerbet alkanols" provide a lower Tg compared to monomers where $R^1$ and $R^2$ are branched, and for reasons explained below these monomers may not be particularly suitable for use in the current curable compositions. The Tg of the homopolymers of such monomers is ≤−20° C., or ≤−30° C., or even ≤−40° C.

These Guerbet alkanol derived (meth)acrylate esters have been used to prepare pressure sensitive adhesives, as described in, for example, U.S. Pat. No. 8,137,807.

Particularly suitable branched alkyl (meth)acrylate monomers with 12 or more carbon atoms, are those which are highly branched, meaning that they contain at least two branch points along the hydrocarbon chain. These are monomers of Formula II wherein at least one of $R^1$ and $R^2$ comprises a branched hydrocarbon chain. These molecules tend to have Tg values that are surprisingly higher than the corresponding straight chain monomers. When the Tg of these monomers is discussed, it is meant that homopolymers of these monomers have a Tg of greater than or equal to −20° C. when measured by DSC (as described in the Tg definition above). In some embodiments, the Tg of particularly suitable branched alkyl (meth)acrylate monomers is greater than or equal to −18° C. when measured by DSC.

Among the particularly suitable branched alkyl (meth) acrylate monomers is the isostearyl acrylate monomer commercially available from Kowa as "NK ESTER S1800 ALC". The chemical of NK ESTER S1800 ALC is shown below as Formula III:

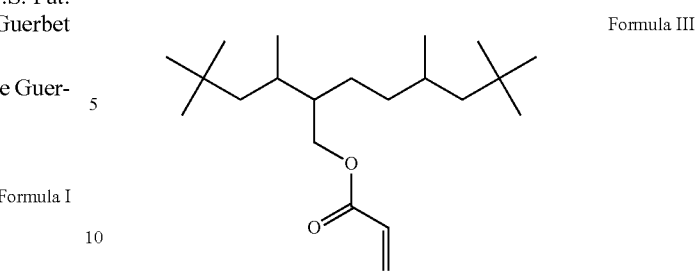

Formula III

In some embodiments, the curable composition may optionally include additional monomers besides the first monomer, referred to in this disclosure as the second monomer. The other monomer may also be a branched monomer. Examples of other suitable branched monomers include isooctyl acrylate, 2-ethylhexyl acrylate, isodecyl acrylate, isopropyl acrylate, isobutyl acrylate, and the like. A wide array of additional monomers are suitable, typically being a monofunctional ethylenically unsaturated monomer and may have a homopolymer Tg of greater than that homopolymer Tg of the first monomer. Without being bound by theory, it is thought that increasing the Tg of the cured ink formulation reduces the mobility of the polarizable bonds in the crosslinked matrix, leading to a lower Dk-Delta, as defined above. Examples of particularly suitable additional alkyl (meth)acrylate monomers include isostearyl acrylate and isobornyl acrylate.

Additionally, the curable ink compositions comprise, besides the first monomer and optional additional monomers, at least one crosslinker. Crosslinkers are well understood in the polymer arts as polyfunctional molecules that link polymer chains together. In the present curable ink compositions, the crosslinker typically is a multifunctional (meth)acrylate. Examples of useful multifunctional (meth) acrylate include, but are not limited to, di(meth)acrylates, tri(meth)acrylates, and tetra(meth)acrylates, such as 1,6-hexanediol di(meth)acrylate, 1,4-butanediol di(meth)acrylate, propylene glycol di(meth)acrylates, ethylene glycol di(meth)acrylates, hydroxy pivalic acid neopentyl glycol di(meth)acrylate, neopentyl glycol di(meth)acrylate, bisphenol A di(meth)acrylates, tricyclodecane dimethanol di(meth) acrylate, poly(ethylene glycol) di(meth)acrylates, polybutadiene di(meth)acrylate, polyurethane di(meth)acrylates, and glycerin tri(meth)acrylate, trimethylolpropane tri(meth) acrylate, tris(2-hydroxyethyl)isocyanurate triacrylate, pentaerythritol tri- and tetra(meth)acrylate and, ditrimethylolpropane tetra(meth)acrylate, dipentaerythritol penta(meth) acrylate, dipentaerythritol hexa(meth)acrylate, ethoxylated and propoxylated versions and mixtures thereof. Particularly suitable crosslinkers include tricyclodecane dimethanol diacrylate, and trimethylolpropane triacrylate. The amount and identity of the crosslinker or crosslinkers can vary, but typically the total amount of crosslinkers are present in an amount of at least 5 weight %. By weight % it is meant the % by weight of the total curable components of the curable ink composition.

The curable ink compositions also comprise a copolymeric additive comprising a polyisobutylene-polysiloxane block copolymer. In some embodiments, the polyisobutylene-polysiloxane block copolymer may be the polyisobutylene-polysiloxane di-block copolymers described above. Other polyisobutylene-polysiloxane copolymers are also suitable. These copolymers typically comprise the reaction product of an ethylenically unsaturated polyisobutylene oligomer and a hydridosilane-functional polysiloxane. The copolymerization reaction is a hydrosilylation reaction. This reaction involves the addition of a hydridosilane group (—Si—H) across a carbon-carbon double bond (—C═C—) as is illustrated by Reaction Scheme II below:

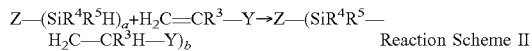
Reaction Scheme II

Wherein Z comprises a siloxane unit; $R^4$ and $R^5$ are independently H atoms or alkyl groups; $R^3$ is an H atom or alkyl group; and Y is a polyisobutylene oligomeric unit. The subscripts a and b are independently integers of 1 or greater and may be the same or different. Typically, the polyisobutylene oligomeric units Y are linear groups whereas the siloxane units Z are branched. Typically this reaction is catalyzed by a metal catalyst, most typically a metallic platinum catalyst.

A wide variety of polyisobutylene oligomers are suitable for use to prepare the copolymeric additives of the present disclosure. These polyisobutylene oligomers typically are monofunctional as shown in Reaction Scheme I. In many embodiments, monofunctional polyisobutylene oligomers are used due to their commercial availability.

While a range of molecular weights are suitable for the polyisobutylene oligomers, typically the oligomer is of a relatively low molecular weight. Generally, the molecular weights of oligomers are presented as number average molecular weights ($M_n$). Suitable polyisobutylene oligomers typically have a $M_n$ that is less than 40,000 g/mol, more typically less than 5,000 g/mol, or less than 2,000 g/mol, or even less than 1,500 g/mol. On the other hand, it is desirable that the molecular weight not be too low. Generally, the molecular weight is greater than 500 g/mol, or even greater than 1,000 g/mol.

Examples of commercially available polyisobutylene oligomers include GLISSOPAL 1000 from BASF; and TPC 175, TPC 1105, TPC 1160, TPC 1285, and TPC 1305 from TPC Group.

Typically, the polysiloxanes contain units of the type: —O—Si($R^6$)$_2$— where $R^6$ is a hydrocarbyl group, typically an alkyl or aryl group, typically a methyl group, and an Si—H (hydridosilane) functional group. A wide range of hydridosilane-functional polysiloxanes are commercially available, including SH1310 (octasilane POSS) from Hybrid Plastics, and a wide range of other hydridosilane-functional materials from suppliers such as Gelest.

In some embodiments, hydridosilane-functional carbosiloxanes are used. Typically the polysiloxanes contain repeat units of the type: —O—Si($R^6$)$_2$—(CH$_2$)$_n$— where $R^6$ is a hydrocarbyl group, typically an alkyl or aryl group, and n is an integer of 2 or greater, in many embodiments n is 2. Frequently, each $R^6$ is an alkyl group, typically methyl.

As mentioned above, a wide variety of block copolymers have been prepared. Each of these copolymers can be prepared utilizing hydrosilylation reactions as illustrated by the general Reaction Scheme II described above, through the selection of reagents and by controlling the stoichiometry.

As mentioned above, typically the polyisobutylene-polysiloxane block copolymer comprises linear polyisobutylene blocks and branched polysiloxane blocks. The branched polysiloxane blocks are siloxane blocks that are not linear and contain at least one branchpoint. In some embodiments, the polyisobutylene-polysiloxane block copolymer comprises a di-block copolymer wherein the polyisobutylene block comprises a linear polyisobutylene block and wherein the polysiloxane block comprises a branched polysiloxane block. Generally, these di-block copolymers are formed by the hydrosilylation reaction of an ethylenically unsaturated linear polyisobutylene oligomer and a silane-functional branched siloxane oligomer. In some embodiments, the ethylenically unsaturated linear polyisobutylene oligomer has a number average molecular weight ($M_n$) of from 500-2,000 grams/mol.

While a wide range of polyisobutylene-polysiloxane block copolymers can be used, typically the polyisobutylene-polysiloxane block copolymer comprises 5-40% by weight polysiloxane content, as described above.

The curable ink composition also comprises at least one initiator. Typically, the initiator is a photoinitiator, meaning that the initiator is activated by light, generally ultraviolet (UV) light, although other light sources could be used with the appropriate choice of initiator, such a visible light initiators, infrared light initiators, and the like. Thus, the curable ink compositions are generally curable by UV or visible light, typically UV light. Therefore, typically, UV photoinitiators are used as the initiator. Photoinitiators are well understood by one of skill in the art of (meth)acrylate polymerization. Examples of suitable free radical photoinitiators include OMNIRAD 4265, OMNIRAD 184, OMNIRAD 651, OMNIRAD 1173, OMNIRAD 819, OMNIRAD TPO, OMNIRAD TPO-L, commercially available from IGM Resins, Charlotte, NC Particularly suitable photoinitiators include those that feature high absorbance above 365 nm wavelength. These include the acylphosphine oxide family of photoinitiators such as OMNIRAD TPO, OMNIRAD TPO-L, and OMNIRAD 819.

Generally, the photoinitiator is used in amounts of 0.01 to 10 parts by weight, more typically 0.1 to 2.0, parts by weight relative to 100 parts by weight of total reactive components.

Besides the curable components described above, the curable ink composition may include additional optional non-curable components, as long as such components do not interfere with curing of the curable ink composition and do not adversely affect the properties of the cured composition. As mentioned above, solvents are not suitable additives for the curable ink compositions, as the curable ink compositions are desirably 100% solids compositions. While a variety of optional components are suitable, since the cured compositions are not pressure sensitive adhesives, as was pointed out above, tack generating agents are not suitable additives, and the curable ink compositions are generally free of tack generating agents. Tack generating agents are resins that are added to polymeric compositions to increase or to generate tack, especially pressure sensitive adhesive tack in the polymeric composition. The ink formulations may also contain polymerization inhibitors, UV absorbers, light stabilizers (e.g. hindered amine light stabilizers (HALS)), adhesion promoters, sensitizers, synergists, antioxidants, catalysts, dispersants, desiccants, surfactants, leveling agents, and the like as needed or desired. It is desirable that any non-curable polymeric components present in the formulation also have a dielectric constant less than or equal to 3 at 1 MHz. Examples of such materials are polyisobutylene oligomers such as the GLISSOPAL series (BASF) and the TPC series (TPC Group, Houston, TX).

One particularly suitable optional additive is an adhesion promoter. An adhesion promoter is used as an additive or as a primer to promote adhesion of coatings, inks, or adhesives to the substrate of interest. An adhesion promoter usually has an affinity for the substrate and the applied coating, ink, or adhesive. Among the suitable adhesion promoters are silane-functional compounds, titanates, and zirconates. Examples of suitable titanates and zirconates include titanium or zirconium butoxide. Typically, if used, the adhesion promoter comprises a silane-functional compound. Sometimes silane-functional adhesion promoters are called coupling agents since they have different functionality at each end of the compound and thus can act to couple different surfaces such as inorganic surfaces and organic surfaces. A wide variety of silane adhesion promoters are suitable such as the (meth)acrylate-functional alkoxy silane SILQUEST A-174 from Momentive Performance Materials. With this type of adhesion promoter the alkoxy silane functionality interacts with an inorganic surface and the (meth)acrylate-functionality co-polymerizes with the curable ink composition. Other examples of silane coupling agents that are suitable include octadecyltrimethoxysilane, isooctyltrimethoxysilane, hexadecyltrimethoxysilane, hexyltrimethoxysilane, methyl trimethoxysilane, hexamethyldisilazane, hexamethyldisiloxane, aminopropyltrimethoxysilane, 3-acryloxypropyltrimethoxysilane and the like.

In some embodiments, the curable ink composition comprises as the curable components 1-94 weight % of the first alkyl (meth)acrylate monomer, 0-50 weight % of the one or more second (meth)acrylate monomer, 1-40 weight % of the polyisobutylene-polysiloxane block copolymer additive; and at least 5 weight % crosslinking monomer. By weight % it is meant the % by weight of the total curable components (not including the initiator) of the curable ink composition. The curable ink composition additionally comprises at least one initiator and any optional non-curable additives.

Also disclosed herein are articles. A wide variety of articles may be prepared utilizing the cured organic layers described above. The articles may be relatively simple articles such as a substrate with a layer of cured organic layer disposed on it. In other embodiments, the articles are more complex, such as multilayer articles comprising a substrate, and an inorganic barrier layer, with a cured organic layer between them, where the cured layer functions as a decoupling layer. The substrate may optionally have an inorganic coating layer present on its surface, so that the cured organic layer may be in contact with substrate surface or with the optional inorganic coating layer.

In some embodiments, the articles comprise a substrate with a first major surface and a second major surface, a cured organic layer with a first major surface and a second major surface, where the first major surface of the cured organic layer is adjacent to at least a portion of the second major surface of the substrate. The cured organic layer comprises a crosslinked (meth)acrylate-based layer that comprises a copolymeric additive comprising a polyisobutylene-polysiloxane block copolymer and has a thickness of from 1-50 micrometers, and has a dielectric constant of 3.0 or less at 1 MegaHertz, and is non-crystalline and optically clear.

A wide variety of substrates are suitable for the articles of this disclosure. Suitable substrates include a wide array of flexible and non-flexible substrates. For example, the substrate may be glass or a relatively thick layer of a polymeric material such as PMMA (polymethyl methacrylate) or PC (polycarbonate). Alternatively, the substrate may be flexible polymeric film such as films of PET (polyethylene terephthalate), PEN (polyethylene naphthalate), PC (polycarbonate), polyimide, PEEK (polyetherether ketone), and the like. In some embodiments, the substrate comprises a thermally sensitive substrate. A wide variety of thermally sensitive substrates are suitable, for example, an OLED panel.

In some embodiments, the substrate comprises an inorganic coating layer present on the second major surface, such that the first major surface of the cured organic layer is in contact with the inorganic coating layer.

The cured organic layer comprises a curable composition that has been deposited and cured on at least a portion of the second major surface of the substrate, where the curable composition comprises a first monomer comprising an alkyl (meth)acrylate monomer with 12 or more carbon atoms, a crosslinking monomer, a copolymeric additive comprising a polyisobutylene-polysiloxane block copolymer, and at least one initiator, as described in detail above. The curable composition can also contain other optional additives as described above. The curable composition is solvent free and inkjet printable, having a viscosity of less than 30 centipoise at a temperature of from room temperature to less than 60° C. The curable composition, upon curing, forms a non-crystalline, optically clear layer with a dielectric constant of less than or equal to 3.0 at 1 MegaHertz.

The cured organic layer has a wide variety of desirable properties. In some embodiments, the cured organic layer has a Dk-Delta value of less than 0.05, where Dk-Delta is the difference between the absolute value of the dielectric constant at 100 kiloHertz and the dielectric constant at 1 MegaHertz. In some embodiments, the cured organic layer has a surface roughness of less than 5 nanometers.

The above described constructions can also be used as components of more complex articles. In some embodiments, the article further comprises a device disposed on the second major surface of the substrate, and adjacent to the first major surface of the cured organic layer. In some embodiments, an inorganic coating layer is disposed on the device and on the second major surface of the substrate, such that the first major surface of the cured organic layer is in contact with the inorganic coating layer. In some specific embodiments, the device comprises an OLED (organic light-emitting diode).

Examples of suitable articles are further described by the figures. An example of a simple article is shown in FIG. 1, where article 100 comprises substrate 120 with cured organic layer 110 disposed on the substrate.

Substrate 120 includes a wide array of flexible and non-flexible substrates. For example, substrate 120 may be glass or a relatively thick layer of a polymeric material such as PMMA (polymethyl methacrylate) or PC (polycarbonate). Alternatively, substrate 120 may be flexible polymeric film such as films of PET (polyethylene terephthalate), PEN (polyethylene naphthalate), PC (polycarbonate), polyimide, PEEK (polyetherether ketone), and the like.

Cured organic layer 110 is a (meth)acrylate-based cured layer of the curable ink compositions described above. Again, it is important to note that while the curable composition is described as an "ink", this just means that the composition is printable and not necessarily that the cured organic layer 110 has been printed, since as described above, other coating methods can also be used. In many embodiments, however, the cured organic layer 110 has been coated by printing, especially inkjet printing, and then has been cured. Cured organic layer 110 has all of the properties described above, namely the layer has a thickness of from 1-50 micrometers, in some embodiments from 5-30 micrometers, the layer has a dielectric constant of 3.0 or less at 1 MegaHertz, and is optically clear. Additionally, in many embodiments, the cured organic layer 110 has a surface roughness of less than or equal to 10 nanometers, in some embodiments less than or equal to 5 nanometers.

Figure 2:
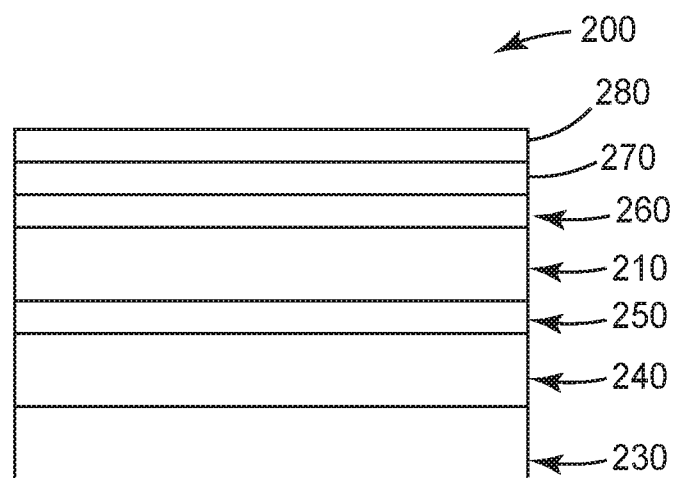
FIG. 2 shows a cross-sectional view of an embodiment of another article of this disclosure.

FIG. 2 shows a device that includes a multilayer article of the present disclosure. FIG. 2 shows article 200 comprising substrate 230 with device 240 disposed on substrate 230. Inorganic barrier layer 250 is in contact with device 240, and cured organic layer 210 is in contact with the inorganic barrier layer 250. FIG. 2 also includes optional inorganic layer 260 that is in contact with cured organic layer 210. Optional layer 270 is in contact with optional inorganic layer 260 and also with substrate 280. Additionally, between optional layer 260 and optional layer 270, there may be optional alternating pairs of layers of cured organic (210) and inorganic (260). For clarity these optional layers are not shown, but one can readily envision a stack of layers in the sequence 250/210/260/210/260, or 250/210/260/210/260/210/260, and so on.

The inorganic barrier layer 250 in contact with cured organic layer 210 can be prepared from a variety of materials including metals, metal oxides, metal nitrides, metal oxynitrides, metal carbides, metal oxyborides, and combinations thereof. A wide range of metals are suitable use in the metal oxides, metal nitrides, and metal oxynitrides, particularly suitable metals include Al, Zr, Si, Zn, Sn, and Ti. One particularly suitable inorganic barrier layer material is silicon nitride.

The thickness of the inorganic barrier layer 250 is not particularly limited, generally it is between 20 nanometers and 1 micrometer (1000 nanometers). More typically the thickness is from 20 nanometers to 100 nanometers.

The inorganic barrier layer can be deposited in a variety of ways. In general, any suitable deposition method can be utilized. Examples of suitable methods include vacuum processes such as sputtering, chemical vapor deposition, ALD (atomic layer deposition), metal-organic chemical vapor deposition, plasma enhanced chemical vapor deposition, evaporation, sublimation, electron cyclotron resonance plasma-enhanced chemical vapor deposition, and combinations thereof.

Optional inorganic barrier layer 260 is of a similar thickness as inorganic barrier layer 250 and may comprise the same inorganic material, or it may be a different inorganic material.

One embodiment of the device 200 is a touch sensing device. In this device, substrate 230 is a thin film transistor, device 240 is an OLED device, optional layer 270 is an optically clear adhesive layer, and substrate 280 is a touch sensor.

Also disclosed herein are methods for preparing articles, especially optical articles. These methods comprise, providing a substrate with a first major surface and a second major surface, providing a curable ink composition, disposing a curable ink composition on the second major surface of the substrate to form a curable layer, and curing the curable layer to form a cured organic layer with thickness of from 1-50 micrometers, where the cured organic layer has a dielectric constant of 3.0 or less at 1 MegaHertz. In many embodiments, the surface roughness of the cured organic layer is less than 10 nanometers, in some embodiments less than or equal to 5 nanometers. To the surface of this cured organic layer may be deposited an inorganic barrier layer.

In many embodiments, the disposing of the curable ink composition on the second major surface of the substrate to form a curable layer comprises printing, especially inkjet printing. As described above, inkjet printing has a variety of desirable features that make it particularly suitable for preparing the curable layer, including the ability to deposit precise patterns on complex substrates and form a uniform coating with a surface roughness that is less than 10 nanometers, in some embodiments less than or equal to 5 nanometers.

The curable ink compositions used in this method are the curable ink compositions described above. Since the curable ink compositions include a photoinitiator, curing of the curable layer comprises photo curing. The nature of the photoinitiator determines the curing conditions, i.e. radiation wavelength used, duration of the exposure to radiation, etc.

As described above, the articles of this disclosure may include additional elements. In some embodiments, the method may further comprise providing a device such as an OLED, and placing the device on the second major surface of the substrate prior to disposing the curable ink composition on the second major surface of the substrate to form a curable layer. Also, the article may further comprise an inorganic layer disposed on the substrate and device surfaces. In these embodiments, the inorganic layer is disposed on the substrate and device surfaces prior to disposing the curable ink composition on the second major surface of the substrate to form a curable layer. Additionally, as described above, additional layers may be added to the exposed surface of the inorganic barrier after the inorganic barrier layer is disposed on the cured organic layer.

The disclosure includes the following embodiments:

Among the embodiments are curable compositions. Embodiment 1 includes a curable composition comprising: a first monomer comprising an alkyl (meth)acrylate monomer with 12 or more carbon atoms; a crosslinking monomer; a copolymeric additive comprising a polyisobutylene-polysiloxane block copolymer, and at least one initiator, wherein the curable composition is solvent free and inkjet printable, having a viscosity of less than 30 centipoise at a temperature of from room temperature to less than 60° C., and upon curing forms a non-crystalline, optically clear layer with a dielectric constant of less than or equal to 3.0 at 1 MegaHertz.

Embodiment 2 is the curable composition of embodiment 1, wherein the polyisobutylene-polysiloxane block copolymer comprises a di-block copolymer wherein the polyisobutylene block comprises a linear polyisobutylene block and wherein the polysiloxane block comprises a branched polysiloxane block.

Embodiment 3 is the curable composition of embodiment 1 or 2, wherein the polyisobutylene-polysiloxane block copolymer comprises 5-40% by weight polysiloxane content.

Embodiment 4 is the curable composition of any of embodiments 1-3, wherein the polyisobutylene-polysiloxane block copolymer is prepared by the hydrosilylation reaction of an ethylenically unsaturated linear polyisobutylene oligomer and a silane-functional branched siloxane oligomer.

Embodiment 5 is the curable composition of embodiment 4, wherein the ethylenically unsaturated linear polyisobutylene oligomer has a number average molecular weight ($M_n$) of from 500-2,000 grams/mol.

Embodiment 6 is the curable composition of any of embodiments 1-5, wherein the curable composition comprises one or more additional second (meth)acrylate monomers.

Embodiment 7 is the curable composition of any of embodiments 1-6, wherein the curable components of the curable composition comprise:
  1-94 weight % of the first monomer;
  0-50 weight % of one or more second (meth)acrylate monomers;
  1-40 weight % of the polyisobutylene-polysiloxane hybrid material; and
  at least 5 weight % crosslinking monomer.

Embodiment 8 is the curable composition of any of embodiments 1-7, further comprising at least one additive selected from polymeric additives, polymerization inhibitors, UV absorbers, light stabilizers, adhesion promoters, sensitizers, synergists, antioxidants, catalysts, dispersants, desiccants, surfactants, and leveling agents.

Embodiment 9 is the curable composition of any of embodiments 1-8, wherein the curable composition is photocurable, curable with ultraviolet or visible light radiation.

Also disclosed are articles. Embodiment 10 includes an article comprising: a substrate with a first major surface and a second major surface; a cured organic layer with a first major surface and a second major surface, where the first major surface of the cured organic layer is adjacent to at least a portion of the second major surface of the substrate, wherein the cured organic layer comprises a crosslinked (meth)acrylate-based layer that comprises a copolymeric additive comprising a polyisobutylene-polysiloxane block copolymer and has a thickness of from 1-50 micrometers, and has a dielectric constant of 3.0 or less at 1 MegaHertz, and is non-crystalline and optically clear.

Embodiment 11 is the article of embodiment 10, wherein the substrate comprises a thermally sensitive substrate.

Embodiment 12 is the article of embodiment 10 or 11, wherein the cured organic layer has a Dk-Delta value of less than 0.05, where Dk-Delta is the difference between the dielectric constant at 100 kiloHertz and the dielectric constant at 1 MegaHertz.

Embodiment 13 is the article of any of embodiments 10-12, wherein the substrate comprises an inorganic coating layer present on the second major surface, such that the first major surface of the cured organic layer is in contact with the inorganic coating layer.

Embodiment 14 is the article of any of embodiments 10-13, wherein the second major surface of the cured organic layer is in contact with an inorganic coating layer.

Embodiment 15 is the article of any of embodiments 10-14, wherein the cured organic layer comprises a curable composition that has been deposited and cured on at least a portion of the second major surface of the substrate, wherein the curable composition comprises: a first monomer comprising an alkyl (meth)acrylate monomer with 12 or more carbon atoms; a crosslinking monomer; a copolymeric additive comprising a polyisobutylene-polysiloxane block copolymer, and at least one initiator, wherein the curable composition is solvent free and inkjet printable, having a viscosity of less than 30 centipoise at a temperature of from room temperature to less than 60° C., and upon curing forms a non-crystalline, optically clear layer with a dielectric constant of less than or equal to 3.0 at 1 MegaHertz.

Embodiment 16 is the article of any of embodiments 10-15, wherein the polyisobutylene-polysiloxane block copolymer comprises a di-block copolymer wherein the polyisobutylene block comprises a linear polyisobutylene block and wherein the polysiloxane block comprises a branched polysiloxane block.

Embodiment 17 is the article of any of embodiments 10-16, wherein the polyisobutylene-polysiloxane block copolymer comprises 5-40% by weight polysiloxane content.

Embodiment 18 is the article of any of embodiments 10-17, wherein the polyisobutylene-polysiloxane block copolymer is prepared by the hydrosilylation reaction of an ethylenically unsaturated linear polyisobutylene oligomer and a silane-functional branched siloxane oligomer.

Embodiment 19 is the article of embodiment 18, wherein the ethylenically unsaturated linear polyisobutylene oligomer has a number average molecular weight ($M_n$) of from 500-2,000 grams/mol.

Embodiment 20 is the article of any of embodiments 10-19, wherein the curable composition comprises one or more additional second (meth)acrylate monomers.

Embodiment 21 is the article of any of embodiments 10-20, wherein the curable components of the curable composition comprise:
1-94 weight % of the first monomer;
0-50 weight % of one or more second (meth)acrylate monomers;
1-40 weight % of the polyisobutylene-polysiloxane hybrid material; and
at least 5 weight % crosslinking monomer.

Embodiment 22 is the article of any of embodiments 10-21, wherein the curable composition further comprises at least one additive selected from polymeric additives, polymerization inhibitors, UV absorbers, light stabilizers, adhesion promoters, sensitizers, synergists, antioxidants, catalysts, dispersants, desiccants, surfactants, and leveling agents.

Embodiment 23 is the article of any of embodiments 10-22, wherein the curable composition is photocurable, curable with ultraviolet or visible light radiation.

Embodiment 24 is the article of any of embodiments 10-23, wherein the cured organic layer has a surface roughness of less than 5 nanometers.

Embodiment 25 is the article of any of embodiments 10-24, wherein the article further comprises a device disposed on the second major surface of the substrate, and adjacent to the first major surface of the cured organic layer.

Embodiment 26 is the article of embodiment 25, further comprising an inorganic coating layer disposed on the device and on the second major surface of the substrate, such that the first major surface of the cured organic layer is in contact with the inorganic coating layer.

Embodiment 27 is the article of embodiment 25, wherein the device comprises an OLED (organic light-emitting diode).

Also disclosed are polyisobutylene-polysiloxane di-block copolymers. Embodiment 28 includes a polyisobutylene-polysiloxane di-block copolymer comprising: a linear polyisobutylene block; and a branched polysiloxane block.

Embodiment 29 is the polyisobutylene-polysiloxane di-block copolymer of embodiment 28, wherein the polyisobutylene-polysiloxane di-block copolymer comprises 5-40% by weight polysiloxane content.

Embodiment 30 is the polyisobutylene-polysiloxane di-block copolymer of embodiment 28 or 29, wherein the polyisobutylene-polysiloxane block copolymer is prepared by the hydrosilylation reaction of an ethylenically unsaturated linear polyisobutylene oligomer and a silane-functional branched siloxane oligomer.

Embodiment 31 is the polyisobutylene-polysiloxane di-block copolymer of embodiment 30, wherein the ethylenically unsaturated linear polyisobutylene oligomer has a number average molecular weight ($M_n$) of from 500-2,000 grams/mol.

Also disclosed are methods of preparing articles. Embodiment 32 includes a method of preparing an article comprising: providing a substrate with a first major surface and a second major surface; providing a curable composition wherein the curable composition comprises: a first monomer comprising an alkyl (meth)acrylate monomer with 12 or more carbon atoms; a crosslinking monomer; a copolymeric additive comprising a polyisobutylene-polysiloxane block copolymer, and at least one initiator, wherein the curable composition is solvent free and inkjet printable, having a viscosity of less than 30 centipoise at a temperature of from room temperature to less than 60° C., and upon curing forms a non-crystalline, optically clear layer with a dielectric constant of less than or equal to 3.0 at 1 MegaHertz; disposing the curable ink composition on at least a portion of the second major surface of the substrate to form a curable layer; curing the curable layer to form a cured organic layer having a first major surface and a second major surface, where the first major surface of the cured organic layer is adjacent to the second major surface of the substrate, and wherein the cured organic layer has a thickness of from 1-50 micrometers.

Embodiment 33 is the method of embodiment 32, wherein the polyisobutylene-polysiloxane block copolymer comprises a di-block copolymer wherein the polyisobutylene block comprises a linear polyisobutylene block and wherein the polysiloxane block comprises a branched polysiloxane block.

Embodiment 34 is the method of embodiment 32 or 33, wherein the polyisobutylene-polysiloxane block copolymer comprises 5-40% by weight polysiloxane content.

Embodiment 35 is the method of any of embodiments 32-34, wherein the polyisobutylene-polysiloxane block copolymer is prepared by the hydrosilylation reaction of an ethylenically unsaturated linear polyisobutylene oligomer and a silane-functional branched siloxane oligomer.

Embodiment 36 is the method of embodiment 35, wherein the ethylenically unsaturated linear polyisobutylene oligomer has a number average molecular weight ($M_n$) of from 500-2,000 grams/mol.

Embodiment 37 is the method of any of embodiments 32-36, wherein the curable composition comprises one or more additional second (meth)acrylate monomers.

Embodiment 38 is the method of any of embodiments 32-37, wherein the curable components of the curable composition comprise:
1-94 weight % of the first monomer;
0-50 weight % of one or more second (meth)acrylate monomers;
1-40 weight % of the polyisobutylene-polysiloxane hybrid material; and
at least 5 weight % crosslinking monomer.

Embodiment 39 is the method of any of embodiments 32-38, wherein the curable composition further comprises at least one additive selected from polymeric additives, polymerization inhibitors, UV absorbers, light stabilizers, adhesion promoters, sensitizers, synergists, antioxidants, catalysts, dispersants, desiccants, surfactants, and leveling agents.

Embodiment 40 is the method of any of embodiments 32-39, wherein the curable composition is photocurable, curable with ultraviolet or visible light radiation.

Embodiment 41 is the method of any of embodiments 32-40, further comprising providing a device; and disposing the device on the second major surface of the substrate prior to disposing the curable ink composition on the second major surface of the substrate to form a curable layer.

Embodiment 42 is the method of embodiment 41, further comprising disposing an inorganic layer on the substrate and device surfaces prior to disposing the curable ink composition on the second major surface of the substrate to form a curable layer.

Embodiment 43 is the method of embodiment 42, further comprising disposing additional layers to the second major surface of the cured organic layer.

Embodiment 44 is the method of embodiment 43, wherein disposing additional layers to the second major surface of the cured organic layer comprises plasma-enhanced chemical vapor deposition.

EXAMPLES

Inks based on hybrid polyisobutylene-siloxane materials were made. Cured and uncured formulations were evaluated for viscosity, dielectric properties, and resistance to plasma processes. These examples are merely for illustrative purposes only and are not meant to be limiting on the scope of the appended claims. All parts, percentages, ratios, etc. in the examples and the rest of the specification are by weight, unless noted otherwise. The following abbreviations are used herein: sec=second; $s^{-1}$=reciprocal seconds; cm=centimeters; mm=millimeter; nm=nanometer; g=gram; °C.=degrees centigrade; W=watt, cps=centipoise; mil=one-thousandth of an inch; sccm=standard cubic centimeter per minute; ppm=parts per million; MHz=Megahertz; kHz=kilohertz; mmol=millimole; mol=mole; Tg=glass transition temperature; min=minute; $min^{-1}$=reciprocal minutes; ml=milliliter; Mn=number-average molecular weight; Mw=weight-average molecular weight.

Materials

| Material | Abbrev. | Description |
|---|---|---|
| Isostearyl acrylate | M1 | Available as "NK-ESTER S1800ALC" from Shin-Nakamura, Tokyo, Japan |
| Hydroxy pivalic acid neopentyl glycol diacrylate | M2 | Available as "M210" from Miwon North America Inc., Exton, PA |
| Trimethylolpropane triacrylate | M3 | Available as "SR351LV" from Sartomer Corp. Exton, PA |
| 2,4,6-Trimethylbenzoylphenylphosphinic acid ethyl ester | M4 | Available as "OMNIRAD TPO-L" from IGM Resins, Charlotte, NC |
| Inhibitor | M5 | Inhibitor, available as "GENORAD 22" from Rahn, Aurora, IL |
| Isobornyl Acrylate (IBOA) | M6 | Available as "MIRAMER M1140" from Miwon North America Inc., Exton, PA |
| Tricyclodecane dimethanol diacrylate | M7 | Available as "T-ACRYLAT" from 3M ESPE, Seefeldt, Germany |
| Propoxylated trimethylolpropane triacrylate | M8 | Available as "MIRAMER M360" from Miwon North America Inc., Exton, PA |
| Polyisobutylene oligomer 1 | PIB 1 | Available as "TPC1305" from TPC Group, Houston, TX |
| Polyisobutylene oligomer 2 | PIB 2 | Available as "TPC1105" from TPC Group, Houston, TX |
| Polyisobutylene oligomer 3 | PIB 3 | Available as "TPC175" from TPC Group, Houston, TX |
| Tetrakis(dimethylsiloxysilane) | — | Available from Gelest, Inc., Morrisville, PA |
| Tetramethylcyclotetrasiloxane | — | Available from Gelest, Inc., Morrisville, PA |

| Material | Abbrev. | Description |
| --- | --- | --- |
| Methyltri(dimethysiloxysilane) | — | Available from ABCR Gmbh, Karlsruhe, Germany |
| Octasilane POSS | — | Available as "SH1310" from Hybrid Plastics, Hattiesburg, MS |
| Platinum divinyltetramethyldisiloxane complex | — | Available from Gelest, Inc., Morrisville, PA |

Synthesis of Branched Alkyl-siloxane Hybrids

Polyisobutylene-Siloxane Polymer 1

A solution of polyisobutylene oligomer 2 (19.75 g, 0.019 mol terminal alkene, $M_n$=1040) and tetrakis(dimethylsiloxysilane) (1.60 g, 0.019 mol SiH) was prepared in hexane (40 mL), and 1 drop platinum divinyltetramethyldisiloxane complex in xylene (2.1-2.4% Pt) was added. The reaction mixture was stirred at 60° C. for 5 days, and hexane was removed in vacuo to give the product as a viscous liquid. GPC (THF): $M_n$=3700, $M_w$=5300, polydispersity=1.43. DSC (10° C. min$^{-1}$, N$_2$): −85° C. ($T_g$)

Polyisobutylene-Siloxane Polymer 2

A solution of polyisobutylene oligomer 2 (27.63 g, 0.026 mol terminal alkene, $M_n$=1040) and tetramethylcyclotetrasiloxane (1.60 g, 0.026 mol SiH) was prepared in toluene (30 mL), and 1 drop platinum divinyltetramethyldisiloxane complex in xylene (2.1-2.4% Pt) was added. The reaction mixture was stirred at 70° C. for 24 hrs, and hexane was removed in vacuo to give the product as a viscous liquid. DSC (10° C. min$^{-1}$, N$_2$): −77° C. ($T_g$).

Polyisobutylene-Siloxane-Polymer 3

A solution of polyisobutylene oligomer 2 (19.41 g, 0.019 mol terminal alkene, $M_n$=1040) and methyltri(dimethylsiloxysilane) (1.67 g, 0.019 mol SiH) was prepared in hexane (20 mL), and 1 drop platinum divinyltetramethyldisiloxane complex in xylene (2.1-2.4% Pt) was added. The reaction mixture was stirred at 50° C. for 5 days, and hexane was removed in vacuo to give the product as a viscous liquid. DSC (10° C. min$^{-1}$, N$_2$): −82° C. ($T_g$).

Polyisobutylene-Siloxane-Polymer 4

A solution of polyisobutylene oligomer 3 (34.28 g, 0.043 mol terminal alkene, $M_n$=791) and tetrakis(dimethylsiloxysilane) (3.58 g, 0.043 mol SiH) was prepared in hexane (35 mL), and 1 drop platinum divinyltetramethyldisiloxane complex in xylene (2.1-2.4% Pt) was added. The reaction mixture was stirred at 50° C. for 5 days, and hexane was removed in vacuo to give the product as a viscous liquid. DSC (10° C. min$^{-1}$, N$_2$): −80° C. ($T_g$).

Polyisobutylene-Siloxane-Polymer 5

A solution of polyisobutylene oligomer 3 (54.0 g, 0.068 mol terminal alkene, $M_n$=791) and tetramethylcyclotetrasiloxane (3.89 g, 0.064 mol SiH) was prepared in hexane (55 mL), and 1 drop platinum divinyltetramethyldisiloxane complex in xylene (2.1-2.4% Pt) was added. The reaction mixture was stirred at 50° C. for 2 days, and hexane was removed in vacuo to give the product as a viscous liquid. GPC (THF): $M_n$=2090, $M_w$=3700, polydispersity=1.28. DSC (10° C. min$^{-1}$, N$_2$): −76° C. ($T_g$).

Polyisobutylene-Siloxane-Polymer 6

A solution of polyisobutylene oligomer 3 (29.1 g, 0.037 mol terminal alkene, $M_n$=791) and methyltri(dimethysiloxysilane) (3.28 ng, 0.037 mol SiH) was prepared in hexane (30 mL), and 1 drop platinum divinyltetramethyldisiloxane complex in xylene (2.1-2.4% Pt) was added. The reaction mixture was stirred at 50° C. for 2 days, and hexane was removed in vacuo to give the product as a viscous liquid. DSC (10° C. min$^{-1}$, N$_2$): −88° C. ($T_g$).

Polyisobutylene-Siloxane Polymer 7

Hydridosilane (SiH)-terminated hyperbranched polycarbosiloxane was prepared as described in Hartmann-Thompson, *Polymer*, 2012, 53(24), 5459-5468. A solution of polyisobutylene oligomer 2 (31.6 g, 0.03 mol terminal alkene, $M_n$=1040) and hydridosilane-terminated hyperbranched polycarbosiloxane (5.47 g, 0.03 mol SiH) was prepared in hexane (70 mL), and 1 drop platinum divinyltetramethyldisiloxane complex in xylene (2.1-2.4% Pt) was added. The reaction mixture was stirred at 60° C. for 2 days, and hexane was removed in vacuo to give the product as a viscous liquid. GPC (THF): $M_n$=7180, $M_w$=14,900, polydispersity=2.08. DSC (10° C. min$^{-1}$, N$_2$): −82° C. ($T_g$).

Polyisobutylene-Siloxane Polymer 8

Hydridosilane (SiH)-terminated hyperbranched polycarbosiloxane was used as per example 7 above. A solution of polyisobutylene oligomer 2 (10 g, 12.6 mmol terminal alkene, $M_n$=791) and hydridosilane-terminated hyperbranched polycarbosiloxane (2.34 g, 12.6 mmol SiH) was prepared in toluene (20 mL), and 1 drop platinum divinyltetramethyldisiloxane complex in xylene (2.1-2.4% Pt) was added. The reaction mixture was stirred at 60° C. for 2 days, and toluene was removed in vacuo to give the product as a viscous liquid. GPC (THF): $M_n$=1500, $M_w$=23,000, polydispersity=12.1. DSC (10° C. min$^{-1}$, N$_2$): −84° C. ($T_g$).

Polyisobutylene-Siloxane Polymer 9

A solution of polyisobutylene oligomer 2 (9.67 g, 9.30 mmol terminal alkene, $M_n$=1040) and octasilane POSS (1.18 g, 9.30 mmol SiH) was prepared in toluene (25 mL), and 1 drop platinum divinyltetramethyldisiloxane complex in xylene (2.1-2.4% Pt) was added. The reaction mixture was stirred at 60° C. for 3 days, and toluene was removed in vacuo to give the product as a viscous liquid. DSC (10° C. min$^{-1}$, N$_2$): −83° C. ($T_g$).

Polyisobutylene-Siloxane Polymer 10

A solution of polyisobutylene oligomer 2 (21.9 g, 27.6 mmol terminal alkene, $M_n$=791) and octasilane POSS (3.52 g, 27.6 mmol SiH) was prepared in toluene (25 mL), and 1 drop platinum divinyltetramethyldisiloxane complex in xylene (2.1-2.4% Pt) was added. The reaction mixture was stirred at 60° C. for 2 days, and toluene was removed in vacuo to give the product as a viscous liquid. DSC (10° C. min$^{-1}$, N$_2$): −83° C. ($T_g$).

Nuclear Magnetic Resonance (NMR)

NMR samples were analyzed as solutions in deuterated tetrahydrofuran (THF). One dimensional (1D) proton $^1$H data were collected for the submitted samples using a Bruker (Billerica, MA) "AVANCEA" 600 MHz NMR spectrometer equipped with a cryogenically cooled probe head. Homo- and hetero-nuclear, two dimensional (2D) $^1$H—$^{29}$Si NMR data were also collected to confirm the spectral assignments. One of the residual proto-solvent resonances was used as a secondary chemical shift reference in the proton dimension (δ=1.73). All of the NMR data were collected with the sample held at 25° C. For polyisobutylene oligomers 1-3, molecular mass and mmol/g terminal alkene were determined by identification of the terminal alkene group in the $^1$H spectrum, and by integration. For polymers 1-7, NMR showed that the hydrosilylation reactions had gone to completion in all cases, with loss of the SiH peak at 4.70 ppm, and loss of the terminal polyisobutylene alkene group with peaks 4.53 and 4.57 ppm in the $^1$H spectrum, accompanied by the appearance of SiCH$_2$ peaks at 0.5-2.0 ppm in $^1$H spectrum, at 7-10 ppm in the $^{29}$Si spectrum (for OSiMe$_2$CH$_2$ in Polyisobutylene-siloxane polymers 1, 3, 4, 6, 7, 8, 9, 10), and at −24 ppm in the $^{29}$Si spectrum (for O$_2$SiMeCH$_2$ in Polyisobutylene-siloxane polymers 2 and 5).

Gel Permeation Chromatography (GPC)

Samples were prepared singly and injected in duplicate. Solutions of known concentration (target 10 mg/mL) were prepared in tetrahydrofuran (THF, stabilized with 250 ppm BHT) in glass scintillation vials. The vials were swirled for at least 14 hours in order to allow dissolution. The solutions were filtered through 0.45μ PTFE syringe filters and analyzed by GPC. An Agilent (Santa Clara, CA) 1260 LC instrument was used with an Agilent "PLgel MIXED-E", 300×7.5 mm I.D column at 40° C., and a NIST polystyrene standard (SRM 705a). A Wyatt Technology Corporation (Goleta, CA) "DAWN HELEOS-II" 18 angle Light Scattering detector and a Wyatt Technology Corporation Optilab T-rEX Differential Refractive Index (DRI) detector were used. ASTRA 6 from Wyatt Technology Corporation was used for data collection and analysis.

Dynamic Scanning Calorimetry (DSC)

DSC samples were prepared for thermal analysis by weighing and loading the material into TA Instruments aluminum DSC sample pans. The specimens were analyzed using the TA Instruments Discovery Differential Scanning Calorimeter (DSC-SN DSC1-0091) utilizing a heat-cool-heat method in standard mode (−155 to ~50° C. at 10° C./min.). After data collection, the thermal transitions were analyzed using the TA Universal Analysis program. The glass transition temperatures were evaluated using the step change in the standard heat flow (HF) curves. The midpoint (half height) temperature of the second heat transition is quoted.

Viscosity Measurements

Rheological measurements were conducted on an ARES G2 strain controlled rheometer using a recessed concentric cylinder geometry (bob of 25 mm diameter and 32 mm length; cup with 27 mm diameter). The measurements were collected at 25 and 50° C. under nitrogen atmosphere. The measurements were obtained at a shear rate of 10 s$^{-1}$.

EXAMPLES

UV-Curable Formulations and Dielectric Spectroscopy

Dielectric test samples were prepared as follows. The Example formulations (Comparative Example 1 (CE1) and Example 1 (E1)) prepared according to the compositions shown in Table 1, were injected with a syringe in between two glass slides that were coated with easy release liner RF02N (SKC Haas, Korea; 2 mil; 51 micrometers). A Teflon or silicone gasket was used to set a 400 micrometer gap with a circular cut out of approximately 4 inch (10.16 cm) diameter. The sample was cured with a Clearstone Technologies (Hopkins, MN) CF200 UV-LED (λ=365-400 nm) for 5 minutes per side, for a total of 10 minutes of UV curing at 100% power. The sample discs were carefully removed from the cell. Dielectric property and electrical conductivity measurements on the discs were performed with an Alpha-A High Temperature Broadband Dielectric Spectrometer modular measurement system from Novocontrol Technologies GmbH (Montabaur, Germany). All testing was performed in accordance with the ASTM D150 test standard.

TABLE 1

| Example | Component 1 - C1 | Parts C1 | C2 | Parts C2 | C3 | Parts C3 | C4 | Parts C4 | C5 | Parts C5 | C6 | Parts C6 |
|---|---|---|---|---|---|---|---|---|---|---|---|---|
| CE1 | PIB 1 | 20 | M1 | 63 | M2 | 15 | M3 | 5 | M4 | 2 | M5 | 0.5 |
| E1 | Polyisobutylene-siloxane Polymer 7 | 20 | M1 | 63 | M2 | 15 | M3 | 5 | M4 | 2 | M5 | 0.5 |

The data are summarized in Table 2, and show that alkyl-siloxane components are compatible additives for UV curable low dielectric ink formulations, and Example 1 (E1) has better optical clarity, better compatibility and lower viscosity than a Comparative Example 1 (CE1), where a polyisobutylene oligomer of comparable mass is used.

TABLE 2

| Example | Viscosity pre-cure (cps, room temperature) | Visual Appearance post-cure | Dielectric constant post-cure (100 kHz) | Dielectric constant post-cure (1 MHz) |
|---|---|---|---|---|
| CE1 | 84 | Cloudy | 2.54 | 2.50 |
| E1 | 57 | Clear | 2.77 | 2.72 |

Viscosity Measurements

Rheological measurements were conducted as described above on the materials shown in Table. The data presented in Table 3 shows that branched alkyl-siloxane hybrids (star architectures 1-6, 9, 10, and hyperbranched architectures 7 and 8) have an order of magnitude lower viscosity than a linear polyisobutylene oligomer of comparable molecular mass.

TABLE 3

Viscosity data

| Material | Viscosity (cps, room temperature) | Viscosity (cps, 50° C.) | Molecular mass $M_n$ (Method) |
|---|---|---|---|
| Comparative PIB 1 | 369,000 | 57,700 | 2700 (NMR) |
| Polyisobutylene-siloxane Polymer 1 | 28,700 | 4860 | 4500 (Calc.) |
| Polyisobutylene-siloxane Polymer 2 | 58,200 | 8680 | 4400 (Calc.) |
| Polyisobutylene-siloxane Polymer 3 | 32,900 | 5220 | 3400 (Calc.) |
| Polyisobutylene-siloxane Polymer 4 | 36,200 | 5990 | 3000 (Calc.) |
| Polyisobutylene-siloxane Polymer 5 | 61,500 | 9370 | 3000 (Calc.) |
| Polyisobutylene-siloxane Polymer 6 | 16,600 | 2810 | 2400 (Calc.) |
| Polyisobutylene-siloxane Polymer 7 | 18,500 | 3570 | 7000 (GPC) |

TABLE 3-continued

Viscosity data

| Material | Viscosity (cps, room temperature) | Viscosity (cps, 50° C.) | Molecular mass $M_n$ (Method) |
|---|---|---|---|
| Polyisobutylene-siloxane Polymer 8 | 9540 | 2070 | 1500 (GPC) |
| Polyisobutylene-siloxane Polymer 9 | 12,000 | 2050 | 9300 (Calc.) |
| Polyisobutylene-siloxane Polymer 10 | 11,300 | 2000 | 7400 (Calc.) |

Dielectric Spectroscopy for Liquids

Dielectric property and electrical conductivity measurements on liquids were performed with an Alpha-A High Temperature Broadband Dielectric Spectrometer modular measurement system from Novocontrol Technologies GmbH (Montabaur, Germany). The Keysight Model 16452A liquid dielectric test fixture was used to contain the liquid as a parallel plate capacitor. The ZG2 extension test interface for the Alpha-A modular measurement system was used to allow automated impedance measurements of the Keysight Model 16452A liquid dielectric test fixture through the Novocontrol software. The dielectric constants were computed from ratio of the capacitance of the test cell with liquid to the capacitance of the test cell with air. In order to measure the high viscosity liquids with the 16452A test cell, the liquid was first heated to 50-55° C. and held at this temperature for 15-30 minutes. The liquid was next injected into the liquid test cell with a syringe. After injection, the liquid was allowed to settle for up to 30 minutes, in order to minimize and avoid formation of air bubbles. After 30 minutes settling, the sample was tested.

The data is presented in Table 4, and shows that alkyl-siloxane hybrids 1-10 have desirably low dielectric constants, and near-constant dielectric constants as a function of frequency (100 kHz-1 MHz range), what is described above as "Dk-delta") comparable to those of linear polyisobutylenes.

TABLE 4

Dielectric constant data (liquids)

| Material (Liquid) | Dielectric constant (100 kHz) | Dielectric constant (1 MHz) |
|---|---|---|
| Comparative PIB 1 | 2.17 | 2.17 |
| Polyisobutylene-siloxane Polymer 1 | 2.19 | 2.19 |
| Polyisobutylene-siloxane Polymer 2 | 2.08 | 2.09 |
| Polyisobutylene-siloxane Polymer 3 | 2.15 | 2.15 |
| Polyisobutylene-siloxane Polymer 4 | 2.21 | 2.21 |
| Polyisobutylene-siloxane Polymer 5 | 2.17 | 2.17 |
| Polyisobutylene-siloxane Polymer 6 | 2.25 | 2.25 |
| Polyisobutylene-siloxane Polymer 7 | 2.28 | 2.28 |
| Polyisobutylene-siloxane Polymer 8 | 2.26 | 2.26 |
| Polyisobutylene-siloxane Polymer 9 | 2.29 | 2.27 |
| Polyisobutylene-siloxane Polymer 10 | 2.30 | 2.29 |

Plasma Treatment of Siloxane Components and Water Contact Angle Measurements

Samples were coated onto glass slides and plasma treated using a Plasma Science Surface Treatment System Model PS0524 (100% oxygen, forward power 400-420 W, reflected power 1-4 W, exposure time 1 minute). Static water contact angles were measured before and after plasma treatment at room temperature, using a Kruss GmbH (Hamburg, Germany) DSA100 contact angle instrument (5 microliter drop delivered at 195 microliters per minute). Mean values of five replicates are given (standard deviations in the range 0.5 to 5 degrees).

These data are presented in Table 5, and show that siloxane segments assemble at the polymer-air interface after coating (polymers have higher angles and greater hydrophobicity than comparatives), and after plasma treatment these segments are converted into a more hydrophilic silica-like layer (lower contact angles and greater hydrophilicity than the same samples before plasma treatment).

TABLE 5

Contact angle

| Material surface | Contact angle (Water) | Contact angle after plasma treatment (Water) |
|---|---|---|
| Comparative PIB 2 | 68 | (95) |
| Comparative PIB 3 | 68 | 70 |
| Polyisobutylene-siloxane Polymer 1 | 122 | 92 |
| Polyisobutylene-siloxane Polymer 2 | 85 | 66 |
| Polyisobutylene-siloxane Polymer 3 | 115 | 97 |
| Polyisobutylene-siloxane Polymer 4 | 74 | 75 |
| Polyisobutylene-siloxane Polymer 5 | 97 | 82 |
| Polyisobutylene-siloxane Polymer 6 | 113 | 51 |
| Polyisobutylene-siloxane Polymer 7 | 135 | 70 |
| Polyisobutylene-siloxane Polymer 8 | 120 | 53 |
| Polyisobutylene-siloxane Polymer 9 | 128 | 75 |
| Polyisobutylene-siloxane Polymer 10 | 130 | 55 |

UV Curable Formulations and Etch Resistance

A silicon wafer (4 inch (10 cm) diameter, University Wafer, Boston, MA) was cleaned with detergent (Deconex 12 NS, Borer Chemie Ag, Zuchwil, Switzerland), deionized water, acetone, and finally isopropanol. The silicon wafer was placed on a hotplate at 250° C. for 15 min to dehydrate, allowed to cool to ambient temperature, and then treated with oxygen plasma (Yield Engineering System G1000, Gas=100% $O_2$, Flow=60 sccm, RF Power=300 W, Time=60 seconds). Example Formulations, as described by Table 6, were coated onto the wafers using a film applicator bar (BYK Additives and Instruments, Wesel Germany, Model 46245) and UV cured with a medium-pressure mercury bulb under a nitrogen purge (Fusion UV Light Hammer 6, Heraeus, Geithersburg, MD).

TABLE 6

| Example | Component 1 -C1 | Parts C1 | C2 | Parts C2 | C3 | Parts C3 | C4 | Parts C4 | C5 | Parts C5 | C6 | Wt % C6 |
|---|---|---|---|---|---|---|---|---|---|---|---|---|
| CE2 | M1 | 40 | M6 | 40 | M7 | 15 | M8 | 5 | — | — | M5 | 0.5 |
| E2 | M1 | 32 | M6 | 32 | M7 | 12 | M8 | 4 | Polyisobutylene-siloxane Polymer 8 | 20 | M5 | 0.5 |
| E3 | M1 | 32 | M6 | 32 | M7 | 12 | M8 | 4 | Polyisobutylene-siloxane Polymer 10 | 20 | M5 | 0.5 |

Figure 3:
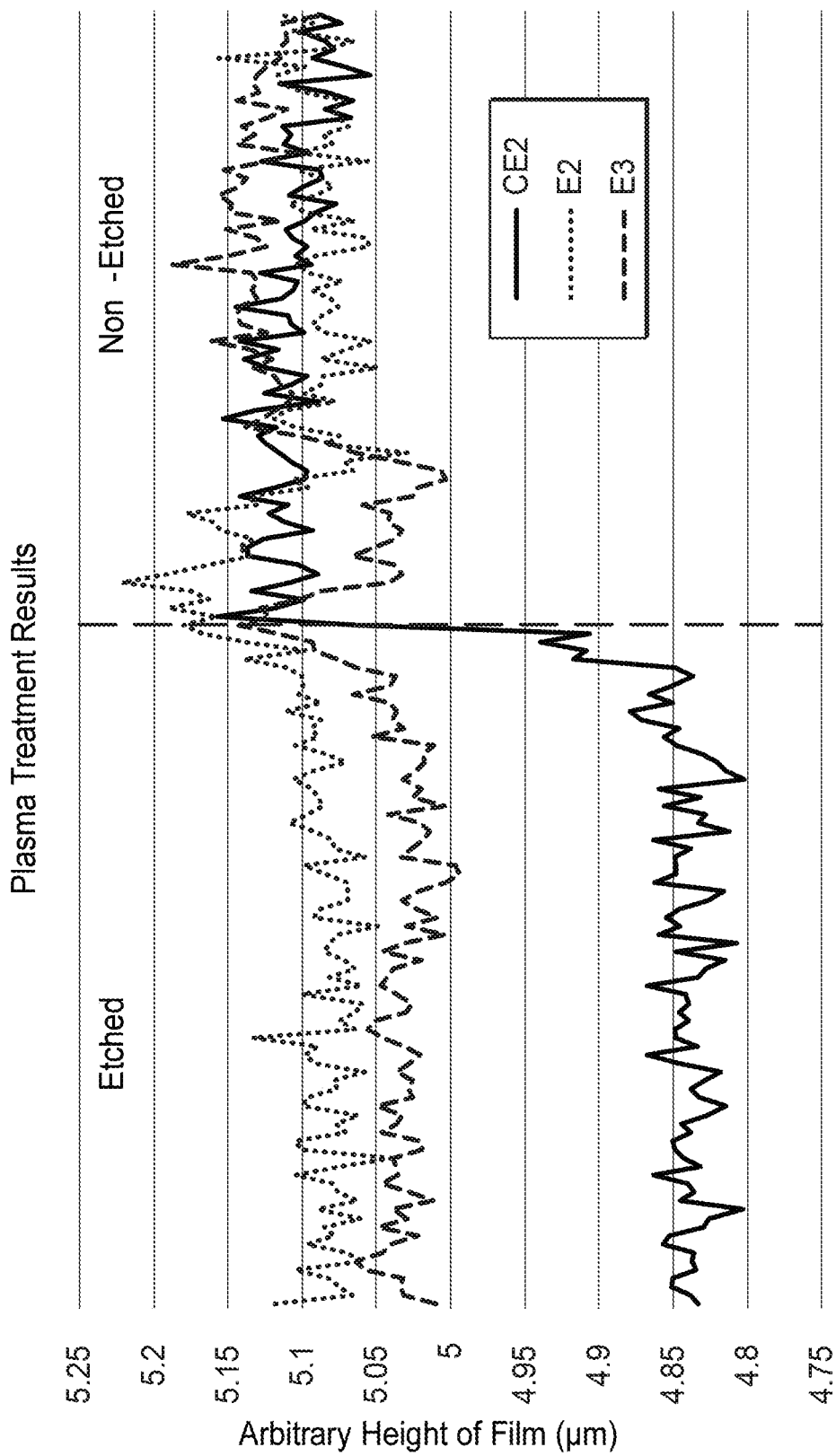
FIG. 3 shows a graph of the Profilometry of the plasma treated articles of Comparative Example CE2, and Examples E2, and E3.

The samples were partially covered with tape (3M Polyester Green Tape, product number 8403, St. Paul, MN) and treated with oxygen plasma for five minutes (Yield Engineering System G1000, Gas=100% $O_2$, Flow=60 sccm, RF Power=300 W, Time=300 seconds). The tape was removed, and the sample was analyzed with white light interferometry (Contour GTX-8, Bruker Inc., Billerica, MA) at the interface of the film area that was partially covered with tape. Vision 64 software and its "modal tilt only" function were used to level the data in order to calculate the step edge (Bruker Inc., Billerica, MA) and determine the step height (see Table 7). The Comparative Example (CE2) showed significant etching as a result of exposure to plasma relative to the side of the sample that was covered with tape ("unetched") during the exposure to plasma. The ink formulations with the etch-resistant additives, Example 2 (E2) and Example 3 (E3) showed no significant etching as a result of exposure to plasma when comparing the etched to the unetched side of the film. FIG. 3 shown an overlay of the profile scans of CE2, E2, and E3 across the etched and non-etched film interface.

TABLE 7

Etch depth after five minutes exposure to oxygen plasma and calculated etch rate

|  | Etch Depth (μm) | Etch Rate (μm/min) |
|---|---|---|
| CE2 | 0.2621 | 0.0524 |
| E2 | −0.0031 | 0.0006 |
| E3 | 0.1109 | 0.0222 |

What is claimed is:

1. A curable composition comprising:
    a first monomer comprising an alkyl (meth)acrylate monomer with 12 or more carbon atoms;
    a crosslinking monomer;
    a copolymeric additive comprising a polyisobutylene-polysiloxane block copolymer, and at least one initiator, wherein the curable composition is solvent free and inkjet printable, having a viscosity, as measured by a rheometer at a temperature of 25° C. or 50° C. and a strain rate of 10 $s^{-1}$, of less than 30 centipoise at a temperature of from room temperature to less than 60° C., and upon curing forms a non-crystalline, optically clear layer with a dielectric constant of less than or equal to 3.0 at 1 MegaHertz.

2. The curable composition of claim 1, wherein the polyisobutylene-polysiloxane block copolymer comprises a di-block copolymer wherein the polyisobutylene block comprises a linear polyisobutylene block and wherein the polysiloxane block comprises a branched polysiloxane block.

3. The curable composition of claim 1, wherein the polyisobutylene-polysiloxane block copolymer comprises 5-40% by weight polysiloxane content.

4. The curable composition of claim 1, wherein the polyisobutylene-polysiloxane block copolymer is prepared by the hydrosilylation reaction of an ethylenically unsaturated linear polyisobutylene oligomer and a silane-functional branched siloxane oligomer.

5. The curable composition of claim 4, wherein the ethylenically unsaturated linear polyisobutylene oligomer has a number average molecular weight ($M_n$) of from 500-2,000 grams/mol.

6. The curable composition of claim 1, wherein the curable composition comprises one or more additional second (meth)acrylate monomers.

7. The curable composition of claim 6, wherein the curable components of the curable composition comprise:
    1-94 weight % of the first monomer;
    0-50 weight % of one or more second (meth)acrylate monomers;
    1-40 weight % of the polyisobutylene-polysiloxane hybrid material; and
    at least 5 weight % crosslinking monomer.

8. The curable ink composition of claim 1, further comprising at least one additive selected from polymeric additives, polymerization inhibitors, UV absorbers, light stabilizers, adhesion promoters, sensitizers, synergists, antioxidants, catalysts, dispersants, desiccants, surfactants, and leveling agents.

9. An article comprising:
    a substrate with a first major surface and a second major surface;
    a cured organic layer with a first major surface and a second major surface, where the first major surface of the cured organic layer is adjacent to at least a portion of the second major surface of the substrate, wherein the cured organic layer comprises a crosslinked (meth)acrylate-based layer that comprises a copolymeric additive comprising a polyisobutylene-polysiloxane block copolymer and has a thickness of from 1-50 micrometers, and has a dielectric constant of 3.0 or less at 1 MegaHertz,
    and is non-crystalline and optically clear, and wherein the cured organic layer comprises a curable composition that has been deposited and cured on at least a portion of the second major surface of the substrate, wherein the curable composition comprises:
    a first monomer comprising an alkyl (meth)acrylate monomer with 12 or more carbon atoms;
    a crosslinking monomer;
    a copolymeric additive comprising a polyisobutylene-polysiloxane block copolymer, and
    at least one initiator, wherein the curable composition is solvent free and inkjet printable, having a viscosity, as measured by a rheometer at a temperature of 25° C. or 50° C. and a strain rate of 10 $s^{-1}$, of less than 30 centipoise at a temperature of from room temperature to less than 60° C.

10. The article of claim 9, wherein the substrate comprises a thermally sensitive substrate.

11. The article of claim 9, wherein the cured organic layer has a Dk-Delta value of less than 0.05, where Dk-Delta is the difference between the dielectric constant at 100 kiloHertz and the dielectric constant at 1 MegaHertz.

12. The article of claim 9, wherein the article further comprises a device disposed on the second major surface of the substrate, and adjacent to the first major surface of the cured organic layer.

13. The article of claim 12, wherein the device comprises an OLED (organic light-emitting diode).

14. A method of preparing an article comprising:
providing a substrate with a first major surface and a second major surface;
providing a curable composition wherein the curable composition comprises:
a first monomer comprising an alkyl (meth)acrylate monomer with 12 or more carbon atoms;
a crosslinking monomer;
a copolymeric additive comprising a polyisobutylene-polysiloxane block copolymer, and
at least one initiator, wherein the curable composition is solvent free and inkjet printable, having a viscosity, as measured by a rheometer at a temperature of 25° C. or 50° C. and a strain rate of 10 s$^{-1}$, of less than 30 centipoise at a temperature of from room temperature to less than 60° C., and upon curing forms a non-crystalline, optically clear layer with a dielectric constant of less than or equal to 3.0 at 1 MegaHertz;
disposing the curable ink composition on at least a portion of the second major surface of the substrate to form a curable layer;
curing the curable layer to form a cured organic layer having a first major surface and a second major surface, where the first major surface of the cured organic layer is adjacent to the second major surface of the substrate, and wherein the cured organic layer has a thickness of from 1-50 micrometers.

15. The method of claim 14, further comprising providing a device; and
disposing the device on the second major surface of the substrate prior to disposing the curable ink composition on the second major surface of the substrate to form a curable layer.

16. The method of claim 14, further comprising disposing additional layers to the second major surface of the cured organic layer.

17. The method of claim 16, wherein disposing additional layers to the second major surface of the cured organic layer comprises plasma-enhanced chemical vapor deposition.

* * * * *